United States Patent

Houng et al.

[11] Patent Number: 5,998,304
[45] Date of Patent: Dec. 7, 1999

[54] LIQUID PHASE DEPOSITION METHOD FOR GROWING SILICON DIOXIDE FILM ON III-V SEMICONDUCTOR SUBSTRATE TREATED WITH AMMONIUM HYDROXIDE

[75] Inventors: Mau-Phon Houng; Yeong-Her Wang; Chien-Jung Huang, all of Tainan, Taiwan

[73] Assignee: National Science Council, Taipei, Taiwan

[21] Appl. No.: 08/922,186

[22] Filed: Sep. 2, 1997

[30] Foreign Application Priority Data

Apr. 3, 1997 [TW] Taiwan .................................. 86104394

[51] Int. Cl.[6] .............................................. H01L 21/8252
[52] U.S. Cl. .......................... 438/758; 438/604; 438/606; 438/500; 438/497; 438/762; 438/779; 438/787; 438/905; 438/906; 438/933; 438/930
[58] Field of Search ...................... 438/604, 496, 438/500, 497, DIG. 930, DIG. 933, 905–906, 779, 787, 758, 762, 606

[56] References Cited

U.S. PATENT DOCUMENTS

| | | | |
|---|---|---|---|
| 5,326,720 | 7/1994 | Goda et al. ............................. | 438/782 |
| 5,378,960 | 1/1995 | Tasker et al. ............................ | 313/103 |
| 5,516,721 | 5/1996 | Galli et al. .............................. | 438/781 |
| 5,650,361 | 7/1997 | Radhakrishnan ....................... | 438/779 |

*Primary Examiner*—Charles Bowers
*Assistant Examiner*—Thanh Nguyen
*Attorney, Agent, or Firm*—Fish & Richardson P.C.

[57] ABSTRACT

A liquid phase deposition method involves the use of a supersaturated hydrofluosilicic acid aqueous solution for growing a silicon dioxide film at low temperature (30° C.–50° C.) on a III-V semiconductor, such as a gallium arsenide substrate. The silicon dioxide film may be used in a bipolar transistor or as a field oxide of MOS (metal oxide semiconductor). The III-V semiconductor substrate is chemically treated with an alkaline aqueous solution such as ammonium hydroxide so that the surface of the III-V semiconductor substrate is modified to facilitate the growth of the silicon dioxide film by liquid phase deposition. The growth rate of the silicon dioxide film is as fast as 1265 Å/hr. The silicon dioxide film has a refractive index ranging between 1.372 and 1.41.

16 Claims, 5 Drawing Sheets

LIQUID PHASE DEPOSITION METHOD FOR GROWING SILICON DIOXIDE FILM ON III-V SEMICONDUCTOR SUBSTRATE TREATED WITH AMMONIUM HYDROXIDE

FIELD OF THE INVENTION

The present invention relates generally to a liquid phase deposition method for growing a silicon dioxide film on a semiconductor substrate, and more particularly to the liquid phase deposition method for growing the silicon dioxide film on III-V semiconductor substrate surface which is modified by ammonium hydroxide.

BACKGROUND OF THE INVENTION

In the recent years, the application of the III-V semiconductor, such as gallium arsenide, as a high speed device in the ULSI (ultra large scalar integral) technology has received more attention than the similar application of the silicon semiconductor, in view of the fact that the III-V semiconductor has a relatively high saturation speed and a relatively low consumption rate of electricity. In the past, the passivation of gallium arsenide (GaAs) in the multilevel interconnection was attained by the thermal oxidation or the anodica. The protective layer so formed is generally composed of the gallium oxide or the arsenic oxide, which is as nonstoichiometrically unstable as the arsenic ion. As a result, the oxide layer of gallium arsenide was seldom used as an insulator.

The silicon dioxide ($SiO_2$) is devoid of free electrons capable of taking part in the conduction of electrical current in view of the fact that the valence electrons of the silicon dioxide and the adjoining atom form a strong bond which can not be easily severed. As a result, the silicon dioxide has been widely used as the insulation film (band gap=11 eV).

The growth of a silicon dioxide film on the silicon substrate may be achieved by a liquid phase deposition method, which is known as the LPD method for short. For more information on the LPD method, please refer to the publications, such as VLSI FABRICATION PRINCIPLES by S. K. Ghandhi, Wiley, New York, 1983; THIN SOLID FILMS by U. Mackens and U. Merkt, 97, 53 (1982); and C. Chiang, D. B. Fraser and D. R. Denison, IEEE VLSI MULTILEVEL INTERCONNECTION CONFERENCE, 381 (1990). According to the above publications, the LPD method involves a first step in which the silicon dioxide powder is dissolved in an aqueous solution containing 34% of hydrofluosilicic acid so as to form the saturated hydrofluosilicic acid aqueous solution at room temperature. The undissolved silicon dioxide powder is subsequently removed from the saturated hydrofluosilicic acid aqueous solution by means of a filter paper having the diameter of 0.2 μm. The saturated hydrofluosilicic acid aqueous solution is then transformed into a supersaturated solution by adding water, boric acid aqueous solution, or ammonium hydroxide to the saturated solution. The silicon substrate is first cleaned and then immersed in the supersaturated solution in which a silicon dioxide film is formed on the surface of the silicon substrate by deposition. Such reactions as described above may be expressed in terms of the following chemical equations.

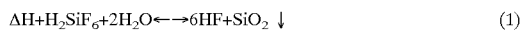
$$\Delta H + H_2SiF_6 + 2H_2O \leftrightarrow 6HF + SiO_2 \downarrow \quad (1)$$

$$H_3BO_3 + 4HF \leftrightarrow BF_4^- + H_3O^+ + 2H_2O \quad (2)$$

$$NH_4OH + HF \leftrightarrow NH_4^+ + F^- + H_2O \quad (3)$$

The LPD method has not been used in gallium arsenide substrate. However, the growth of the silicon dioxide film on the gallium arsenide substrate or the III-V semiconductor substrate by the LPD method has become an important technical subject in view of the promising application potential of the gallium arsenide in the ULSI technology.

SUMMARY OF THE INVENTION

It is therefore the primary objective of the present invention to provide an LPD method for growing the silicon dioxide film on the III-V semiconductor substrate or the gallium arsenide substrate. The LPD method of the present invention is capable of producing the ULSI high speed device at a substantially low cost.

In keeping with the principle of the present invention, the foregoing objective of the present invention is attained by the LPD method consisting of an initial step in which the surface of a III-V semiconductor substrate is chemically treated by immersing in an alkaline aqueous solution. The III-V semiconductor substrate is removed from the alkaline aqueous solution and then submerged in a liquid phase deposition solution in which the silicon dioxide film is formed on the surface of the III-V semiconductor substrate by deposition.

The III-V semiconductor substrate used in the LPD method of the present invention may be GaAs or InP, preferably GaAs.

Preferably, the alkaline aqueous solution used in the LPD method of the present invention for modifying the surface of the substrate is an ammonium hydroxide ($NH_4OH$) aqueous solution having an ammonium hydroxide concentration ranging between 1% and 70wt %, preferably between 15 wt % and 30 wt %.

According to the LPD method of the present invention, the III-V semiconductor substrate is submerged in the alkaline aqueous solution at a temperature ranging between 10° C. and 50° C., preferably at the room temperature, and for a duration lasting between 0.1 and 10 minutes.

The LPD method of the present invention further includes a drying step in which the chemically-treated III-V semiconductor substrate is dried by evaporation in an inert gas which is constantly circulated.

The liquid phase deposition solution used in the present invention is a supersaturated aqueous solution of hydrofluosilicic acid ($H_2SiF_6$), which is formed of hydrofluosilicic acid having a concentration in the range of 1.3–1.7M, and boric acid having a concentration in the range of 0–0.01M, or ammonium hydroxide having a concentration ranging between 0 and 0.005M. Preferably, the $H_2SiF_6$ supersaturated aqueous solution of the LPD method of the present invention contains the boric acid ranging in concentration from 0.001M to 0.01M. Selectively, the $H_2SiF_6$ supersaturated aqueous solution contains the ammonium hydroxide ($NH_4OH$) in a concentration range of 0.0008–0.002M.

A method suitable for preparing the $H_2SiF_6$ supersaturated aqueous solution of the LPD method of the present invention consists of an initial step in which a predetermined amount of the silicon dioxide powder is dissolved is 2–4M $H_2SiF_6$ aqueous solution. The undissolved silicon dioxide powder is removed from the solution by filtration. Thereafter, water and optionally a boric acid or ammonium hydroxide aqueous solution are added to the filtrate.

The method of the present invention discloses a semiconductor device, which consists of a gallium arsenide (GaAs) substrate, an uniform interface layer formed on the surface of the GaAs substrate, and a passivation layer of silicon dioxide formed on the interface. The silicon dioxide passivation layer in addition to the O—Si—O bond contains a silicon-fluorine bond, and the interface layer contains gallium oxide (GaOx).

The foregoing objective, features, functions and advantages of the present invention will be more readily understood upon a thoughtful deliberation of the following detailed description of an embodiment of the present invention with reference to the accompanying drawings.

DETAILED DESCRIPTION OF THE INVENTION

Figure 1:
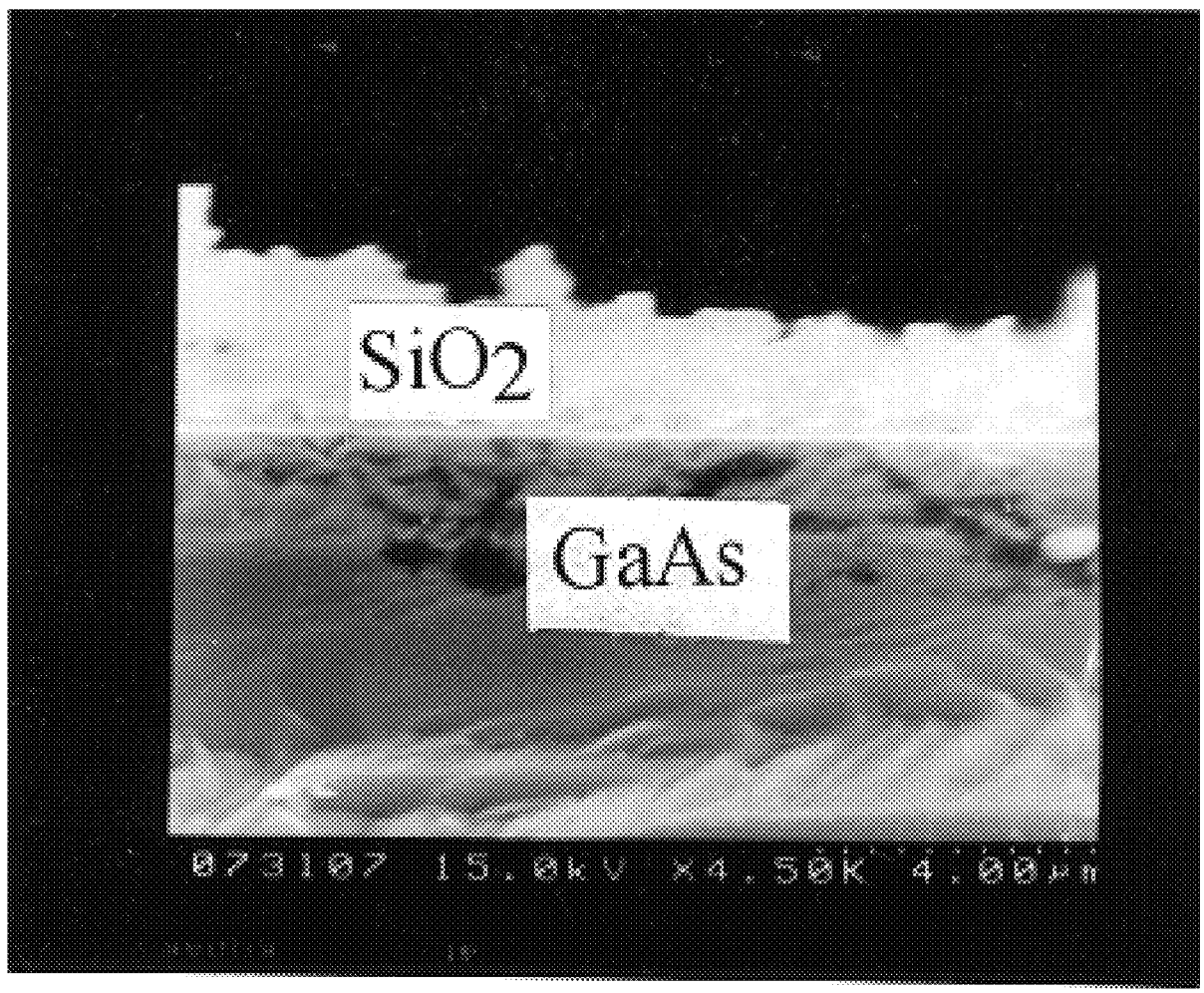
FIG. 1 is a scan electron microscopy (SEM) photograph showing a sectional view of a silicon dioxide ($SiO_2$) layer formed by the method of the present invention on a gallium arsenide (GaAs) substrate.

In order to overcome the technical difficulty of growing a silicon dioxide layer on the III-V compound substrate by liquid phase deposition (LPD), the method of the present invention employs a chemical treatment capable of forming a number of OH bonds on the surface of the substrate so as to facilitate the growth of the silicon dioxide layer on the substrate by LPD. The chemical treatment preferably is able to be carried out at room temperature so that the entire process of growing the silicon dioxide layer on the surface of the substrate can be completed at an extremely low temperature, thereby enhancing the efficiency of the LPD method in improving the process flexibility of the IC preparation at low temperature. The chemical treatment is carried out by immersing a III-V compound substrate in an alkaline aqueous solution, such as ammonium hydroxide or hydrogen peroxide.

According to the embodiment of the present invention, a gallium arsenide (GaAs) substrate was chemically treated such that a silicon dioxide layer could be grown by LPD on the modified surface of the GaAs substrate having a 100-orientation and a resistivity of $2.0–2.8 \times 10^{-3}$ Ω-cm. Prior to the chemical treatment, the GaAs substrate was cleaned by immersing the GaAs substrate in acetone for 10 minutes. The GaAs substrate was then removed from the acetone and was once again immersed in methanol for ten minutes. The GaAs substrate was removed from the methanol and was subsequently rinsed with pure water (19 MΩ-cm) for five minutes. Upon completion of the rinsing of the GaAs substrate with pure water, the GaAs substrate was immersed in an ammonium hydroxide aqueous solution (29% $NH_4OH:H_2O=1:1$) at 27° C. for one minute. The GaAs substrate was removed therefrom and finally dried by a nitrogen gas current.

We believe that, as a result of the chemical treatment described above, a gallium oxide ($GaO_x$) film was formed on the surface of the GaAs substrate, which in turn enables growth of a silicon dioxide layer thereon by LPD.

The LPD of the present invention was carried out a supersaturated $H_2SiF_6$ aqueous solution, which was prepared by dissolving silicon dioxide powder in a 3.09M $H_2SiF_6$ aqueous solution such that a saturated $H_2SiF_6$ aqueous solution was formed by agitation at room temperature. The undissolved silicon dioxide powder was removed from the saturated $H_2SiF_6$ aqueous solution by filtration. To 45 ml of the saturated $H_2SiF_6$ aqueous solution 38.43 ml of water was added, and the resulting solution was stirred for several minutes. 9.27 ml of 0.1M boric acid aqueous solution was then added and the resulting solution was stirred for several minutes to form a supersaturated $H_2SiF_6$ aqueous solution. Upon completion of the preparation of the supersaturated $H_2SiF_6$ aqueous solution, the chemically-treated GaAs substrate was immediately immersed in the freshly-prepared supersaturated $H_2SiF_6$ aqueous solution at 40° C. for 1.5 hours for growing a silicon dioxide layer on the GaAs substrate by deposition. At the conclusion of the deposition process, the GaAs substrate was removed from the supersaturated $H_2SiF_6$ aqueous solution to facilitate the measuring of thickness and refractive index of the silicon dioxide layer formed on the GaAs substrate. The measurements of thickness and refractive index of the silicon dioxide were done by an ellipsometer. The growth rate of the silicon dioxide layer is about 1265 Å/hr while the refractive index of the silicon dioxide layer is in the range of 1.37–1.41.

As shown in FIG. 1, it is readily apparent that the method of the present invention has inherent advantages. For example, a flat and uniform interface was formed between the GaAs substrate and the $SiO_2$ layer. In addition, the $SiO_2$ layer was formed on the GaAs substrate in a layer-upon-layer pattern without forming islands.

Figure 2:
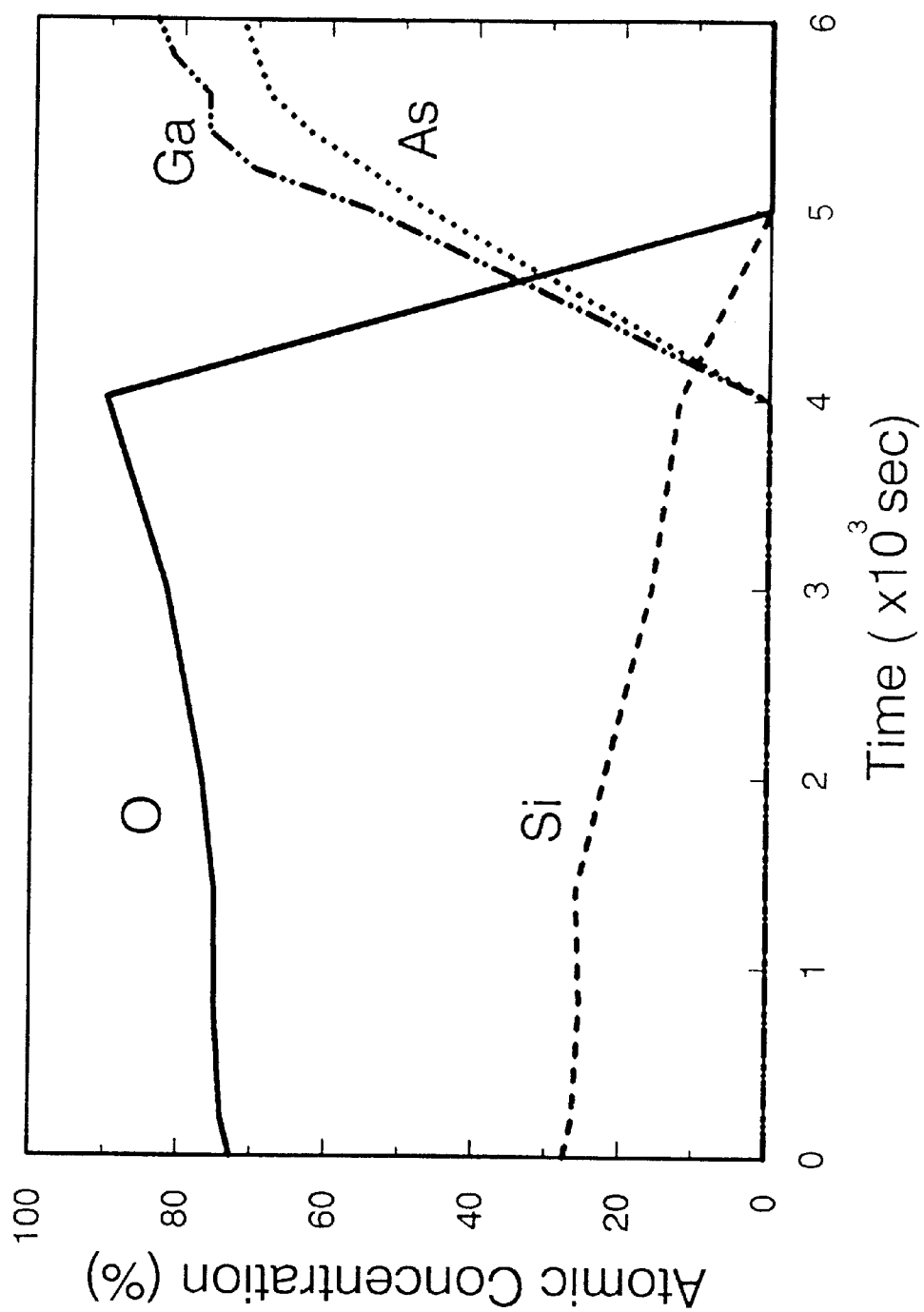
FIG. 2 shows an Auger electron spectrometer (AES) depth profile of the gallium arsenide substrate on which a silicon dioxide layer is formed by the method of the present invention, with the x-axis representing the sputtering time and the y-axis representing the atomic concentration.

Now referring to FIG. 2, the AES depth profile of the GaAs substrate reveals that a substantially constant molar ratio between silicon and oxygen atoms exists from the surface of the $SiO_2$ layer towards the area contiguous to the interface. The gallium atoms diffuse outwards from the surface of the gallium arsenide while the silicon atoms diffuse inwards. As a result, the molar ratio of the silicon atoms and the oxygen atoms is smaller than ½ in the interface, with the implication being that a thin oxide layer exists in the vicinity of the interface to enable the growth of the silicon dioxide layer on the gallium arsenide substrate. In other words, the chemical treatment of the surface of the gallium arsenide substrate results in an increase in the OH bonds on the substrate surface so as to promote the growth of the thin oxide layer in the vicinity of the interface.

Figure 3:
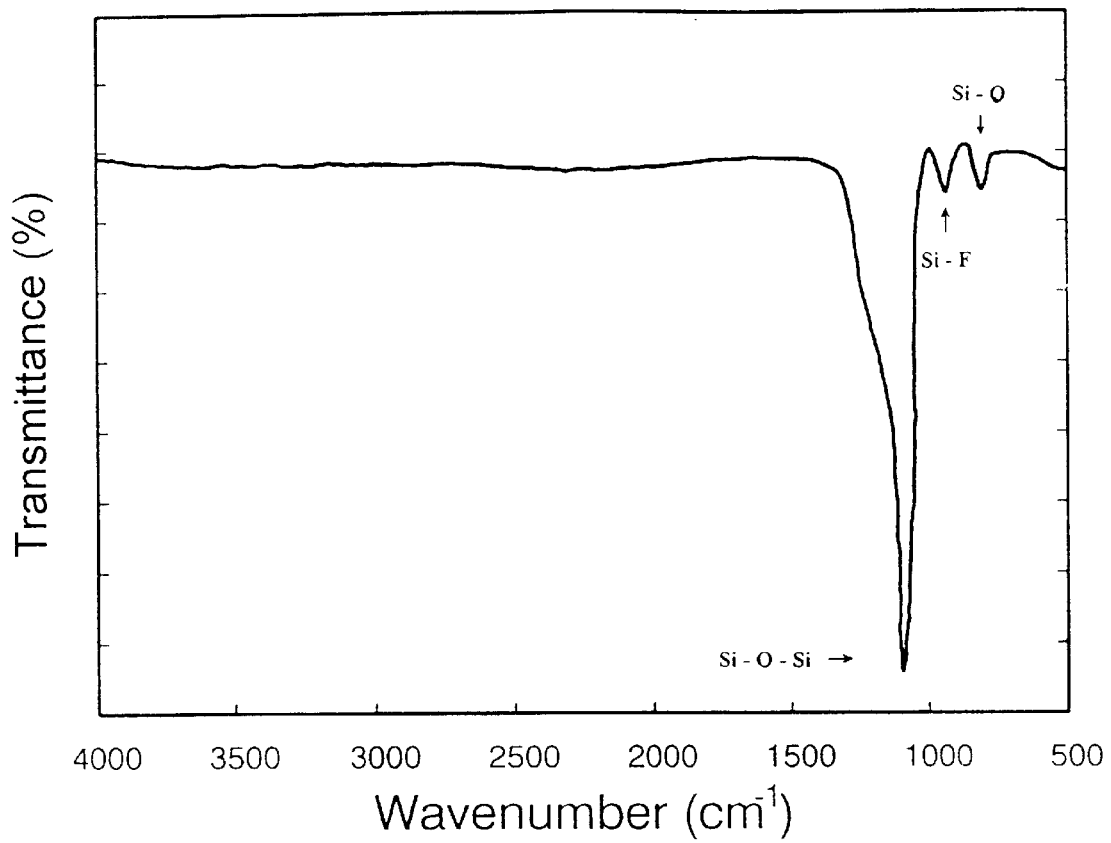
FIG. 3 shows a Fourier transform infrared (FTIR) spectrum of the gallium arsenide substrate on which a silicon dioxide layer is formed by the method of the present invention.

The positive effect of the chemical treatment of the gallium arsenide substrate on the growth of the silicon dioxide layer on the surface of the GaAs substrate is evidenced by the FTIR spectrum shown in FIG. 3. In FIG. 3, the peaks at 1088 $cm^{-1}$ and 930 $cm^{-1}$ are respectively corresponding to the Si—O—Si bond and the Si—F bond. It is therefore concluded that the growth of the silicon dioxide layer of excellent quality on the gallium arsenide substrate is attributable to the chemical treatment of the gallium arsenide substrate.

Figure 4:
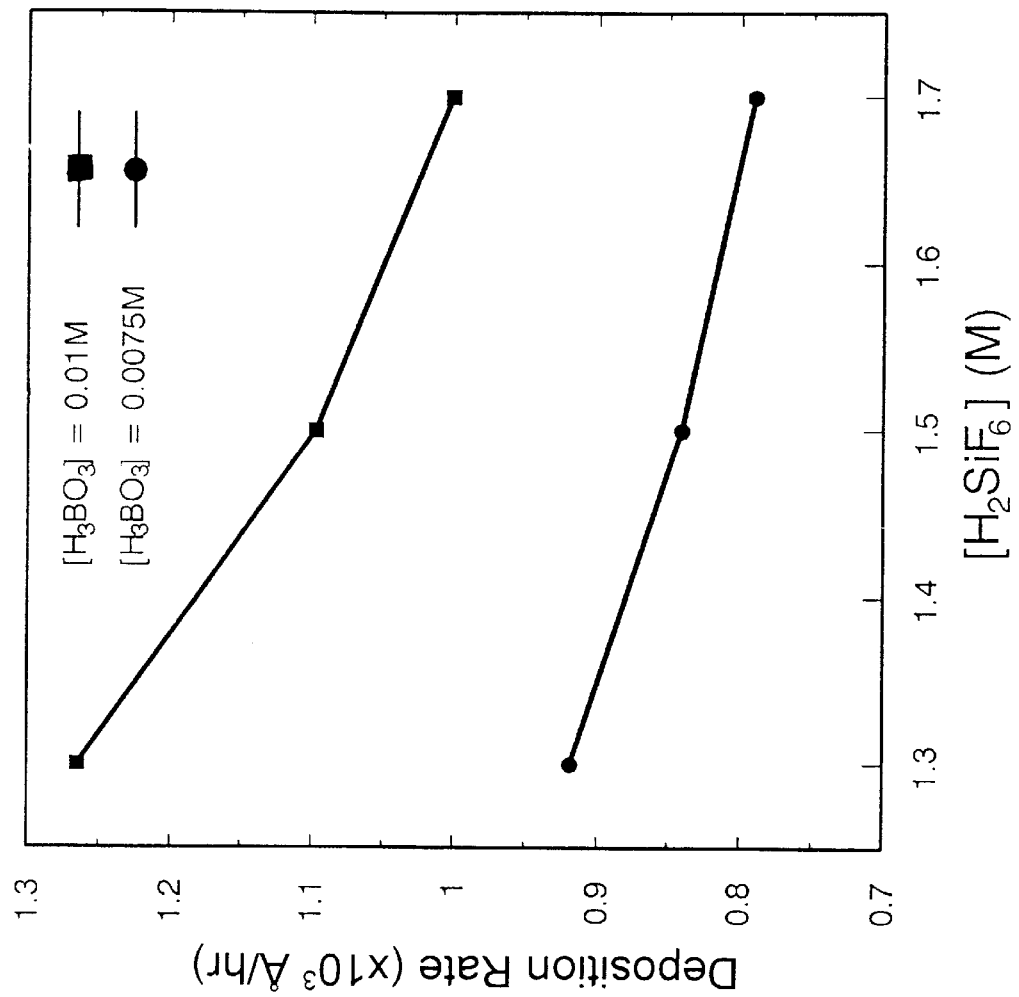
FIG. 4 shows a relationship between the concentration of the $H_2SiF_6$ supersaturated aqueous solution and the $SiO_2$ deposition rate of the LPD method of the present invention, with the black-square curve representing the boric acid concentration of 0.01M and the black-circle curve representing the boric acid concentration of 0.0075M.

As shown in FIG. 4, the deposition rate of $SiO_2$ is not directly proportional to the concentration of $H_2SiF_6$, on the condition that other parameters are kept constant. This is due to the fact that the reactant is not provided with a metastable potential for depositing the silicon dioxide. However, it must be noted that the deposition rate of the silicon dioxide increases as the concentration of the boric acid contained in the supersaturated $H_2SiF_6$ aqueous solution is increased.

Figure 5:
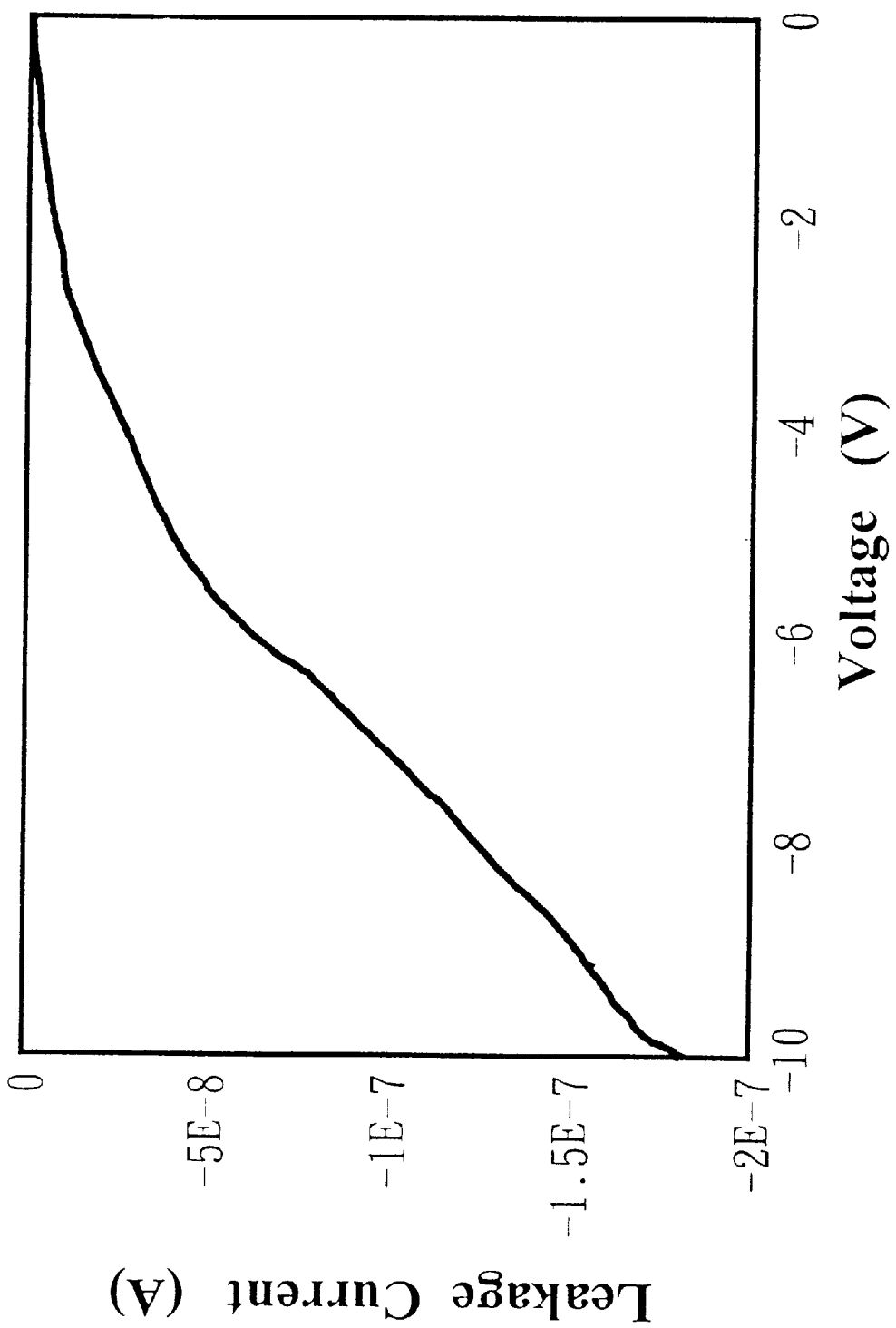
FIG. 5 shows the current-voltage (I-V) characteristics of the gallium arsenide substrate with the silicon dioxide layer formed thereon by the method of the present invention.

As illustrated in FIG. 5, the GaAs-based semiconductor device made by the method of the present invention has a leakage current of $40 \times 10^{-9}$ A at $-5$ V and a breakdown electric field of 7.6 MV/cm.

In view of the embodiment described above, it is therefore readily apparent that the chemical treatment of the surface of the GaAs substrate is crucial to the successful growth of the silicon dioxide film on the surface of the GaAs substrate by the LPD method of the present invention. Such a GaAs-based semiconductor device made by the LPD method of the present invention has the refractive index ranging between 1.372 and 1.41. In the meantime, the deposition rate of the method of the present invention is as high as 1265 Å/hr. It must be also pointed out here that the LPD method of the present invention can be successfully performed at low temperature. In other words, the LPD method of the present invention is a cost-effective process for producing a GaAs-based semiconductor device of excellent quality. It is believed that the LPD method of the present invention can be successfully used to grow the silicon dioxide film on the zincblende III-V semiconductor substrate.

The embodiment of the present invention described above is to be deemed in all respects as being illustrative and not restrictive. Accordingly, the present invention may be embodied in other specific forms without deviating from the spirit thereof. The present invention is therefore to be limited only by the scopes of the following appended claims.

What is claimed is:

1. A method for growing a silicon dioxide film on a III-V semiconductor substrate by liquid phase deposition, said method comprising the following steps:
   (a) cleaning a III-V semiconductor substrate;
   (b) immersing the cleaned III-V semiconductor substrate in an alkaline aqueous solution to form an oxide film on the surface of the substrate;
   (c) removing the III-V semiconductor substrate from the alkaline aqueous solution; and
   (d) growing a silicon dioxide film onto the oxide film on the surface of the III-V semiconductor by liquid phase deposition.

2. The method as defined in claim 1, wherein said III-V semiconductor substrate is a GaAs substrate or InP substrate.

3. The method as defined in claim 2, wherein said III-V semiconductor substrate is a GaAs substrate.

4. The method as defined in claim 1, wherein said alkaline aqueous solution is an aqueous solution of ammonium hydroxide having a concentration of 1–70 wt %.

5. The method as defined in claim 2, wherein said alkaline aqueous solution is an aqueous solution of ammonium hydroxide having a concentration of 15–30 wt %.

6. The method as defined in claim 1, wherein the step (b) is carried out at room temperature.

7. The method as defined in claim 1, wherein the step (b) lasts for a duration from 0.1 to 10 minutes.

8. The method as defined in claim 1, wherein the III-V semiconductor substrate removed from the alkaline aqueous solution is dried by evaporation in an inert gas prior to the step (d).

9. The method as defined in claim 8, wherein the inert gas is kept circulating while the III-V semiconductor substrate is being dried.

10. The method as defined in claim 1, wherein the liquid phase deposition of the step (d) comprising immersing the III-V semiconductor substrate from the step (c) in a supersaturated hydrofluosilicic acid ($H_2SiF_6$) aqueous solution.

11. The method as defined in claim 10, wherein the supersaturated hydrofluosilicic acid aqueous solution contains the hydrofluosilicic acid having a concentration ranging between 1.3 and 1.7M; and wherein the supersaturated hydrofluosilicic acid aqueous solution further contains boric acid having a concentration in the range of 0–0.01M, or ammonium hydroxide having a concentration ranging between 0 and 0.005M.

12. The method as defined in claim 11, wherein the supersaturated hydrofluosilicic acid ($H_2SiF_6$) aqueous solution contains the boric acid having a concentration ranging between 0.001 and 0.01M.

13. The method as defined in claim 11, wherein the supersaturated hydrofluosilicic acid ($H_2SiF_6$) aqueous solution contains the ammonium hydroxide having a concentration ranging between 0.0008 and 0.002M.

14. The method as defined in claim 1, wherein the liquid phase deposition of the step (d) is carried out at a temperature ranging between 10° C. and 50° C.

15. The method as defined in claim 10, wherein the supersaturated hydrofluosilicic acid ($H_2SiF_6$) aqueous solution is prepared by dissolving silicon dioxide powder in a hydrofluosilicic acid aqueous solution containing hydrofluosilicic acid having a concentration in the range of 2–4M; removing undissolved silicon dioxide powder from the hydrofluosilicic acid aqueous solution so as to form a saturated hydrofluosilicic acid aqueous solution; and adding thereto selectively a boric acid aqueous solution or an ammonium hydroxide aqueous solution.

16. The method as defined in claim 1, wherein the alkaline aqueous solution is a hydrogen peroxide aqueous solution.

* * * * *